United States Patent [19]

Yamazaki

[11] Patent Number: 4,963,524
[45] Date of Patent: Oct. 16, 1990

[54] SPUTTERING DEVICE FOR MANUFACTURING SUPERCONDUCTING OXIDE MATERIAL AND METHOD THEREFOR

[75] Inventor: Shunpei Yamazaki, Tokyo, Japan

[73] Assignee: Semiconductor Energy Laboratory Co., Ltd., Atsugi, Japan

[21] Appl. No.: 246,611

[22] Filed: Sep. 30, 1988

[30] Foreign Application Priority Data

Sep. 24, 1987 [JP] Japan ................... 62-241875
Sep. 24, 1987 [JP] Japan ................... 62-241876

[51] Int. Cl.⁵ .................... H01L 39/00; C23C 14/35
[52] U.S. Cl. ............................ 505/1; 204/192.24;
204/298.17; 505/727; 505/731
[58] Field of Search ............ 204/192.24, 298 ME,
204/298 FP, 298.17; 505/1, 816, 727, 731

[56] References Cited

U.S. PATENT DOCUMENTS 4,183,797  1/1980  Kennedy et al. ........... 204/192.12
4,407,894 10/1983  Kadokura et al. .......... 428/457
4,544,468 10/1985  Munz ..................... 204/192.12

FOREIGN PATENT DOCUMENTS 142965  7/1980  Fed. Rep. of Germany ............ 204/298.17

OTHER PUBLICATIONS

*Wall Street Journal*, Jul. 9, 1987, article by David Stipp, p. 23, Cols. 1-3.

Primary Examiner—Aaron Weisstuch
Attorney, Agent, or Firm—Sixbey, Friedman, Leedom & Ferguson

[57] ABSTRACT

A sputtering device to produce a thin film of a superconducting oxide material, in which a pair of targets with a film-forming surface portion thereon are mutually separated and facing each facing each other, so that a magnetic field is applied between the targets which are placed parallel or perpendicular to this magnetic field, whereby crystal orientation is caused to occur during the growth of the film by obtaining direct contact between this magnetic field and the film-forming surface portion.

7 Claims, 3 Drawing Sheets $(IIIa\ IIa_2)Cu_3\ O_{7-x}$

SPUTTERING DEVICE FOR MANUFACTURING SUPERCONDUCTING OXIDE MATERIAL AND METHOD THEREFOR

BACKGROUND OF THE INVENTION

1. Field of the Invention

The present invention relates to a magnetic field type of sputtering device and its process for manufacturing a superconducting oxide ceramic material film.

2. Description of the Related Art

Recently, superconducting ceramic materials have been attracting a great deal of attention. These materials were first reported by IBM's Zurich Laboratories in the form of Ba-LaCu-O (BALACUO) type high temperature superconducting oxide material. In addition, the YBCO ($YBa_2CuO_{6-8}$) types are also known. However, these types could be prepared only by mixing and firing various types of oxide powders to form tablets, so that even when a Tc onset of 90K was obtained, a sufficiently thin film was not possible. In addition, it was completely unknown that the thin film formed at a lower temperature can have crystal grains uniformly oriented in a direction with reference to the surface portion on which the film is formed (which is hereinafter referred to as the film-forming surface portion).

The critical current density of these superconducting materials with polycrystalline oxide structure in tablets is small. In order to correct this problem it is desired that all the ab surfaces of the crystal grains (also referred to as the C surface, the surface perpendicular to the c axis direction) be mutually oriented.

Furthermore, it is strongly desired that the Tco (temperature at which resistance is zero) of the superconducting oxide material be higher. It is desirable that operation be possible at the temperature of liquid nitrogen (77K) or a higher temperature, and that, in turn, the Tco temperature of 90K or higher be available in the structure of the thin film.

With such an objective in mind, the inventor of the present invention filed Japanese patent application No. 62-75205 on Mar. 27, 1987 covering a "Method for manufacturing a superconducting material" which was a method for manufacturing a superconducting material by applying a magnetic field during a heating process.

The present invention is a further development of the above-mentioned invention.

SUMMARY OF THE INVENTION

These objects are accomplished in the present invention by the provIsion of a device using a sputtering method to produce a thin film of a superconducting oxide material, in which a pair of targets are mutually separated and facing each other. A magnetic field is then applied between the targets. A target with a film-forming surface portion is placed in this magnetic field, so that the crystals of the superconducting oxide material are oriented parallel or perpendicular to the film-forming surface portion. A device based on the crystal anisotropy of the superconducting oxide material can be easily produced with capability of operating at a large electric density.

BRIEF DESCRIPTION OF THE DRAWINGS

These and other objects, features, and the advantages of the present invention will become more apparent from the following description of the preferred embodiments taken In conjunction with the accompanying drawings, in which.

DETAILED DESCRIPTION OF THE PREFERRED EMBODIMENTS

A device using a sputtering method to produce a thin film of a superconducting oxide material according to the present invention has two targets which are mutually separated and facing each other. A magnetic field is then applied between the targets. The target with a film-forming surface portion is placed parallel or perpendicular to this magnetic field, so that by obtaining direct contact between this magnetic field and the film-forming surface portion, crystal orientation is caused to occur during the growth of the film.

When the thin film is cooled down to the activation temperature, cracks are likely to take place because the coefficients of thermal expansion of the substrate and the thin film are different each other. In this invention, the thin film is formed at a sufficiently low temperature, between room temperature and 500° C., so that the cracks do not take place, and even at such a low temperature, single crystals or polycrystals with the crystal axis oriented in the prescribed direction can be fabricated.

Figure 1:
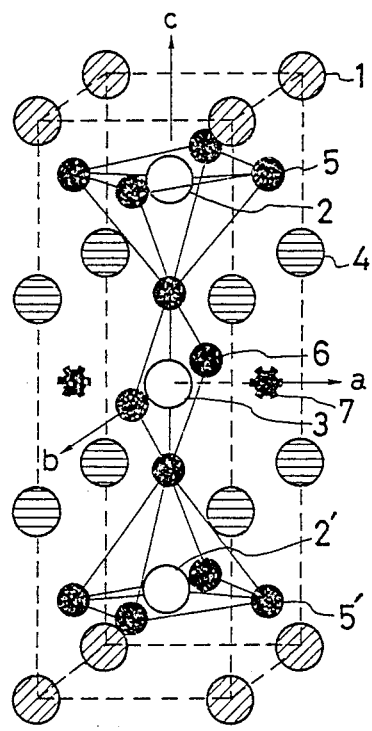
FIG. 1 is a diagram showing one example of the crystal structure of the superconducting oxide material used in the present invention.

Furthermore, when a thin film of superconducting oxide material is produced, as shown in FIG. 1, the a, b, or c axes of a crystal having a modified perovskite structure are oriented parallel or roughly parallel to a desired direction for the application with the film-forming surface portion directly subjected to the magnetic field used also for plasma generation to carry out sputtering or the like. By means of this magnetic field, the growth surfaces of the crystals are positioned in a uniform direction, and magnetic axial growth occurs. In addition, in the case where single crystals are grown, magnetic epitaxial growth occurs.

As a result, during the formation of a thin film, by the simultaneous application on the film-forming surface portion of a strong magnetic field of 0.1 T or more, and preferably 0.2 to 3 T, used for plasma creation, it becomes possible to form a uniformly oriented film on the film-forming surface portion at a lower temperature, preferably from room temperature to 500° C. Simultaneously, reactive gases or particles which are sputtered from the target are being mutually subjected to a plasma reaction in active oxygen or a gas containing active oxygen made by means of plasma, and the reaction product forms a superconducting oxide material film on the film forming surface portion with the crystals axes uniformly oriented in a single direction. Thus, the critical current density in the direction of, for example, the c surface (the surface parallel to the ab axis, specifically the ab surface) is improved to $1 \times 10^5$ $A/cm^2$ or greater (in this case, the ab surface can be in a direction parallel to the surface of the substrate).

A representative superconducting oxide material used in the present invention is an oxide using elements in Group IIa and Group IIIa of the Periodic Table and copper.

The superconducting material of the present invention can be generally represented by the expression $(A_{1-x}B_x)_y Cu_zO_w$, where $x=0.1$ to 1, $y=2.0$ to 4.0, preferably 2.8 to 3.5, $z=1.0$ to 4.0, preferably 1.5 to 3.5, and $w=4.0$ to 10.0, preferably 6 to 8. One representative example is a material having a modified perovskite structure represented by the expression $AB_2Cu_3O_{6-8}$. A is at least one member selected from the yttrium group and the other lanthanoids. The yttrium group is defined as the group containing y (yttrium), Gd (gadolinium), Yb (ytterbium), Eu (europium), Tb (terbium), Dy (dysprosium), Ho (holmium), Er (erbium), Tm (thulium), Lu (lutetium), Sc (scandium), and other lanthanoids—Physics and Chemistry Dictionary (Iwanami Shoten, published Apr. 1, 1963).

B is at least one member selected from the group of Ba (barium), Sr (strontium). or Ca (calcium).

The superconducting oxide material illustrated in the present invention has the crystal structure as shown in FIG. 1, which is a modified perovskite structure. It has a plane including copper (2) and its neighboring oxygen (5), and other planes including copper (3), oxygen (6) positioned next to it, and oxygen vacancy (7), and including copper (2') and oxygen (5'). It has an element (1) from Group IIIa of the Periodic Table, for example y, and an element (4) from group IIa of the Periodic table, for example, Ba.

The inventor of the present invention, suggests as the mechanism which creates superconductivity, that by means of the mutual action of oxygen (5), (5') having a layer structure, and copper (2). (2') which is at the center of the layer, electrons which are paired (electron pair) shift the surface (the surface formed at the ab axes, specifically the surface parallel to the C surface). Up to this time, mutual action with a phonon was considered to be the cause of the formation of the paired electrons, based on the BCS theory.

However, the inventor of the present invention hypothesizes a theory that a quasiparticle known as a magnon is created when upper and lower oxygen vacancies (7) between which this laminar structure is sandwiched (the other vacancy exists in the atomic system which is positioned on the upper or lower side of the diagram) are associated with each other or with a rare earth element (1) which is a screw magnetic body, and that the quasiparticle acts as an intermediary to form a pair of electrons spinning in opposite directions. Specifically, the magnon fluctuates in the c axis direction in the drawing (the fluctuation of the magnon in the direction perpendicular to the ab surface is best reflected in the electron pair), and this magnon, which draws one of the electrons in pair having spinning in mutually opposite directions, is repelled by the other. The magnon is not completely in evidence but works behind &he scenes, and the electron pairs shift in the direction parallel to their respective a-b axes in a surface with a laminar structure surface made from (2), (5) and surface made from (2'), (5')). This can be considered as the cause of superconductance. In addition, it is possible to consider that the fluctuation of the oxygen vacancy is the fluctuation of the phonon, and therefore to have a pattern which supplements the BCS theroy, in which it can be considered that the phonon, through the medium of the magnon, indirectly causes the electron pair to form.

Because a magnetic field according to this principle of action causes a major effect, a magnetic field is positively applied from external sources to a plasma atmosphere between the targets during film formation. Furthermore, the strong magnetic field used in the plasma atmospher is utilized, so that most and desirably all of the crystals having diamagnetism are uniformly positioned in the prescribed direction during the formation of the film, conforming to the dIrection of the magnetic field.

In the present invention, a pair of separated opposing targets are provided. A plasma is produced between these two targets using a mixed gas of argon and oxygen. Then using this plasma the targets are subjected to a sputtering process and a superconducting oxide material is formed on the film-forming surface portion. At this time, a magnetic field is applied to the space between the two targets. Then, one end becomes the north pole while the other end becomes the south pole. When this occurs, a magnetic field is applied in the space between the targets at right angles to the target surfaces, and a film of superconducting oxide material is easily formed with the c axis conforming to this magnetic field.

Then the polycrystal film can be formed in which the respective crystal axes of the crystals forming the thin film are substantially uniformly oriented. Desirably, by using the substrate in which the surface on which the growth occurs and the orientation of its axis are in agreement in a crystal direction, magnetic epitaxial growth, specifically the formation of thin single crystal film is obtained.

In this case, the superconducting oxide material having a single crystal structure is obtained at a low temperature of 500° C. or less. In the C surface in FIG. 1 (the surface parallel to the ab axes), electric current easily flows in an amount 100 times or more than the flow in the perpendicular direction (c axis direction). For this reason, when using polycrystals, it is extremely important that polycrystals having scattered crystal orientations be arranged to have the crystal axis positioned in one direction in order to obtain a high critical current density.

In this way one crystal particle developing into a polycrystal can become larger. In turn, because adjacent crystals have the same crystal axis in common, the barrier at the crystal boundary has more of a tendency to disappear, and a structure equivalent to the single crystal can be obtained. Then, the respective crystals can all become adjusted at the ab surface (the surface perpendicular to the o axis). As a result, by the method of the present invention, the critical current density, which up to the present has been $10^2 A/cm^2$ (77K) in the case of random crystal orientation, increases up to $10^4$ to $10^6 A/cm^2$ (measured at 77K) with the current flowing parallel to the ab surface, and can become equal in density to a single crystal or close to about the 1/5 level. Then, it becomes easier to make a thin film of the single crystal structure of large area, which is ideal for a superconducting oxide material.

In addition, the crystal axis of the substrate which has the film-forming surface portion is effectively adjusted by the magnetic field, conforming to the direction of arrangement of the crystals. For example, the crystal substrate (100) of MgO (magnesium oxide), $SrTiO_3$ (strontium titanium oxide), and YSZ (yttrium stabilized zirconium) can be used, and a magnetic field applied in the direction perpendicular to the film-forming surface portion to create a film, so that the ab surface can be formed parallel to the film-forming surface portion. In addition, using these crystal substrates which have a (110) surface, when a magnetic field is applied parallel to the film-forming surface portion, it is possible to obtain the ab surface formed in the direction perpendicular to the film-forming surface portion during film-forming or heat and magnetic field annealing after the film is formed. Then it is possible to obtain a thin film of a single crystal or of polycrystals close to the single crystal.

EMBODIMENT NO. 1

Figure 2:
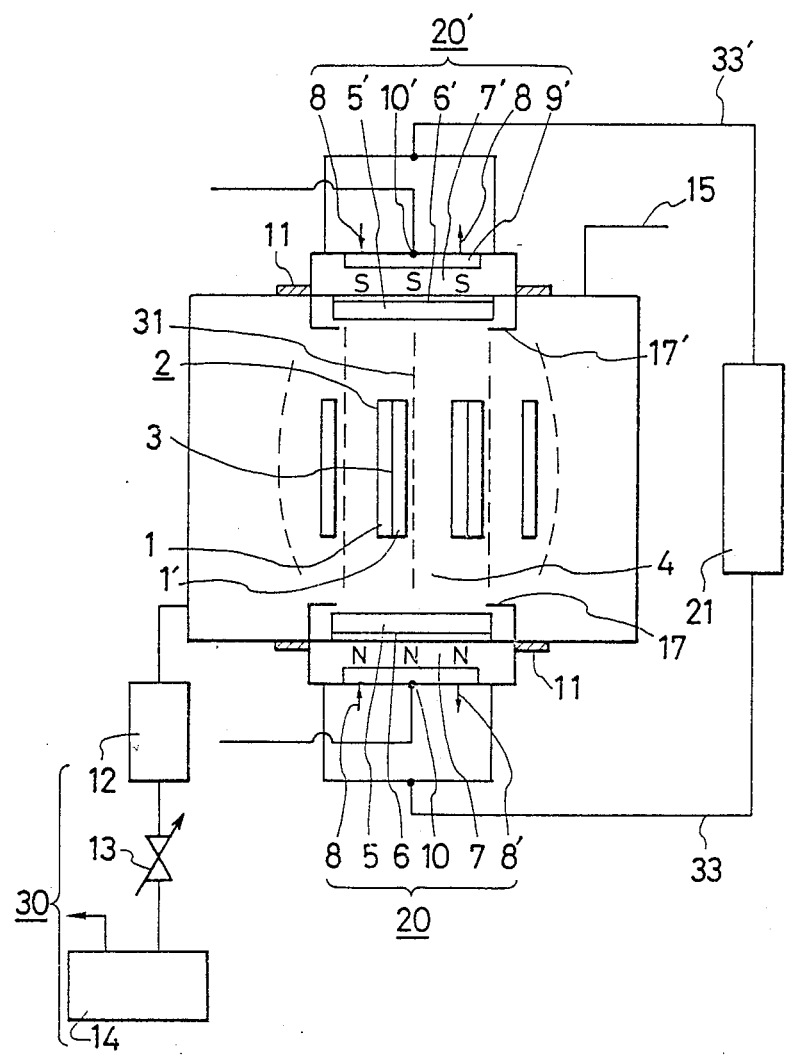
FIG. 2 is a diagram showing the magnetic field type of sputtering device of the present invention.

Now referring to FIG. 2, this drawing shows the sputtering device of the present invention for manufacturing a superconducting oxide material, which comprises a pair of target systems 20, 20' in mutual opposition, a magnetic field generating space 4, a doping system 15, an exhaust gas system 30, and a magnetic field circuit.

The magnetic field circuit comprises a north magnet 7 and a south magnet 7', which form a magnetic circuit of a low magnetic resistance outside of the magnetic field generating region together with a pair of magnetic paths 33, 33' and a coil 21 for generating a magnetic field, thus making it possible to form a strong magnetic field 31, preferably 0.1 T or greater.

The doping system 15 introduces a gas comprising argon, oxygen, and other elements used as additives. The exhaust gas system 30 comprises a turbo molecular pump 12, a pressure regulating valve 13' and a rotary pump 14. A pair of substrates 1, 1' are positioned in intimate contact at their rear surface 3 with a holder (omitted from the drawings) which also serves as a heater. These substrates 1, 1' can be heated from the room temperature up to a maximum of 800° C.

However, in the device which uses the principle of the present invention, heating from room temperature to 500° C. is adequate to form a thin film. This drawing shows the case where the film-forming surface portions of the substrates 1, 1' are positioned in parallel to the magnetic field 31 between the opposing target systems 20, 20'.

The forming of the film generally takes place at room temperature. The distance between the targets 5, 5' is 10 to 25 cm, and the substrates are positioned in a region between the targets where a magnetic field (0.3 T) exists.

The targets 5, 5' are comprised of a compressed superconducting oxide material represented by the expression $(A_{l-x}B_x)_y Cu_z O_w X_v$, where $x = 0.1$ to $1.0$, $y = 2.0$ to $4.0$, $z = 2.0$ to $4.5$, and $w = 4.0$ to $8.0$. These targets contain 20% excess copper to satisfy the stoichiometric ratio. Disposed on the reverse side of the targets 5, 5' are a pair of backing plates 6, 6', a pair of magnets 7, 7', a cooling water inlet 8, a cooling water outlet 8', and a pair of shield plates 17, 17'. These assemblies are electrically isolated from the body of the sputtering device by a Teflon (a registered trademark for polytetrafluoroethylene) insulating body 11. A pair of current introducing terminals 10, 10' are provided to apply a negative high voltage (in the case where the substrates are grounded electrodes) to the targets 20, 20'. Alternatively with the substrate as the base, a negative high voltage may be applied to one target and a positive high voltage to the other target, so that a complementary alternating voltage may be applied.

The following are examples of EMBODIMENT NO. 1.

EXAMPLE NO. 1

A material represented by the expression $YBa_2Cu_{3-3.6}O_{6-8}$ was used as the targets 5, 5'. The distance between the targets 5, 5' and the substrates gas 20 cm. Six sheets of substrates of 10 cm × 10 cm square were positioned in the middle section between the targets 5, 5'. The argon pressure was $4 \times 10^{-1}$ Pa, and the oxygen pressure $5 \times 10^{-3}$ Pa. The DC sputtering output ranged from 500 w to 1 KW. The targets 5, 5' were rectangular with one side being 30 cm in length. The substrates 1, 1' were kept at the room temperature, and the adjacent magnetic field 31 was 0.3 T.

Under such conditions a superconducting oxide material 2 was formed at a film forming speed in the range of 10 to 100 A/min, for example, 40 A/min on the film-forming surface portions of the substrates 1, 1'. Following this, plasma oxidation annealing with magnetic field applied was carried out on all of these in another chamber (omitted from the drawings, but positioned on either the right or the left side of the sputtering chamber) connected to the reaction chamber 4.

Annealing was carried out for 8 hours at 200° to 450° C. under plasma oxidation, followed by cooling. A superconducting oxide material was obtained with a Tco of 96K and a critical current density of $3 \times 10^5$ A/cm$^2$ (measured at 77K).

EXAMPLE NO. 2

Figure 3:
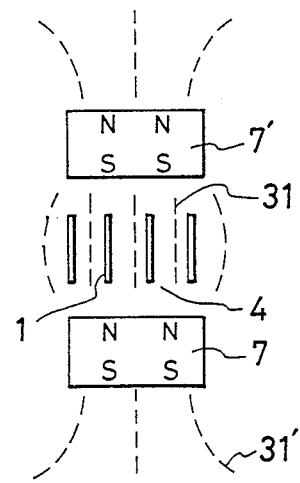
FIG. 3 and FIG. 4 are diagrams showing one part of another embodiment of the device of the present invention shown in FIG. 2.

One of the targets 5, 5' was formed from a material represented by the expression $YBaCu_{3-4}O_{6-8}$ and the other from a material represented by the expression $YbSr_2Cu_{3-4}O_{6-8}$. A film represented by the expression $Y_{0.5}Yb_{0.5}BaSrCu_3O_{6-8}$ was formed. The argon pressure was $4 \times 10^{-1}$ Pa, and the oxygen pressure $1 \times 10^{-2}$ Pa. The rest of this embodiment is the same as in FIG. 2 with the exception of the part shown in FIG. 3.

In this case, the magnets 7, 7' were permanent magnets (rare earth type). These magnets formed a divergent magnetic field 31' outside of the magnetic field generating region 4. For this reason, even using a rare earth type magnet, only a value up to 0.01 T could be obtained. In spite of this fact, a superconducting oxide material was obtained from the effect of this magnetic field.

The parts not shown in the drawings are the same as in FIG. 2. Under these conditions it was possible to produce a material represented by the expression $Y_{0.5}Yb_{0.5}Ba_2Cu_3O_{6-8}$. As much as 90% of the polycrystal axes in the material obtained were arranged so that their c axes were oriented roughly parallel to the film-forming surface portion (within ±30 deg. from the c axis).

EMBODIMENT NO. 2

Figure 4:
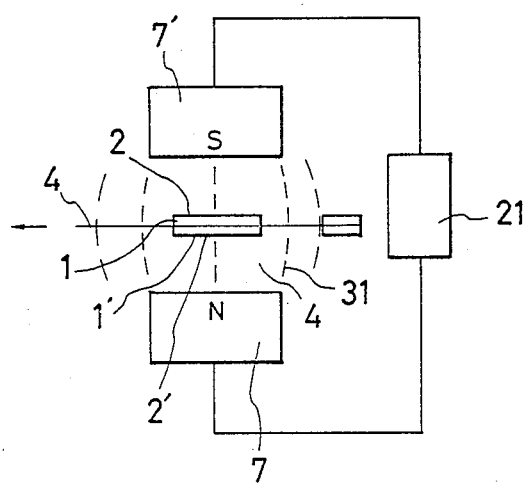

FIG. 4 shows another embodiment of the present invention.

In this embodiment, substrates 1, 1' were provided on the upper and lower sides of the holder, so that the film-forming surface portions are placed perpendicular to the magnetic field 31. Then, the c axis of the deposited film of superconducting oxide material 2, 2' was oriented at right angles to the substrate.

It was possible to form a magnetic field of 0.6 T and obtain a thin film of a thickness of 3 μm by means of a magnetic field generating means (superconducting coil) 21 with a magnetic circuit of a low magnetic resistance formed outside of the region 4.

A material represented by the expression YBaSrCu$_3$O$_{6-8}$ was used as a component material. In this manner, it was possible in the thin film of superconducting oxide material to position the c axis perpendicular to the film-forming surface portion and to make the ab surface parallel to the film-forming surface portion. As a result, a critical current density of 1.7 ×10$^5$ A/cm$^2$ was obtained for a superconducting oxide material thin film formed on a film-forming surface portion of, for example, polycrystals of glass, alumina, ZrO$_2$ or the like or of amorphous structure on the substrate. A Tco of 93K was obtained.

Embodiment No. 3

The substrate of Embodiment No. 1 was changed to a single crystal of MgO (100) or SrTiO$_3$ (100). Then a magnetic field of 2 T was applied throughout film-forming on the film forming surface portion, and the substrate temperature was maintained at 450° C. A single crystal thin film 1 cm$^2$ or greater in area and 3.5 μm thickness was obtained on the substrate. A critical current density of 2.7×10$^6$ A/cm$^2$ (77K) and a Tco of 98K were obtained.

Embodiment No. 4

The substrate of Embodiment No. 2 was changed to a single crystal of MgO (110) or SrTiO$_3$ (110). Then a magnetic field of 2 T was applied on the film-forming surface portion, and the substrate temperature was maintained at 450° C. A single crystal thin film of about 5 mm$^2$ in area and 3 μm thickness was obtained on the substrate. A critical current density of 1.9×10$^6$ A/cm$^2$ in a surface parallel to the ab surface and a Too of 97K were obtained.

In summary, by the use of the present invention, it has become possible to create a thin film superconducting oxide material with the crystal axes uniformly oriented which operates at the temperature of liquid nitrogen or higher, which up to now has been impossible to attain. It is also possible to make an oriented polycrystal superconducting oxide thin film on the surface of a substrate of amorphous structure such as glass, silicon oxide, or silicon nitride or the like. In the case where the growth of the crystal structure is in a direction conforming to the substrate crystal axis, it is possible for the first time to utilize this material as a lead wire at the electrode section of a semiconductor integrated circuit in which contact is possible with the semiconductor without performing a direct oxidizing reaction, because an oriented film can be obtained at a substrate temperature between room temperature and 500° C.

In addition, mixtures of various elements from Group IIa and IIIa of the Periodic Table can be obtained, so that it is easier to form a laminated structure with the polycrystal structure of the compounds of the materials obtained in this manner. As shown in the present invention because a more unIform molecule arrangement can be obtained by applying a magnetic field during heating, it is possible to eliminate voids and reduce the height of crystal grain barriers in the final compound, and in turn it is assumed that a higher Tco can be obtained.

In the present invention, the magnetic field generating source was provided on the rear side of the targets. However, it is also acceptable for the magnetic field to be realized by the provision of a cylindrical air core sec&ion by means of an electric magnet enclosing the space between the vertical targets as a shown in FIG. 2. It is also acceptable to apply the magnetic field between a pair of targets provided with the NS orientation perpendicular to the target direction (the lateral direction in FIG. 2), and not facing in the same direction as the targets. In addition, this magnetic field may be a rotary magnetic field.

The superconducting material used in the present invention should not be limited to the structure in FIG. 1. The present invention is also effective with a superconducting material which can respond to an external magnetic field, and therefore, to a magnetic superconducting material.

Superconducting ceramics for use in accordance with the present invention also may be prepared in conformity with the stoichiometric formula $(A_{l-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and x=0 to 1; y=2.0 to 4.0, preferably 2.5 to 3.5; z=1.0 to 4.0, preferably 1.5 to 3.5; and w=4.0 to 10.0, preferably 6.0 to 8.0. Also, superconducting ceramics for use in accordance with the present invention may be prepared consistent with the stoichiometric formulae $(A_{l-x}B_x)_yCu_zO_w$, where A is one or more elements of Group Vb of the Periodic Table such as Bi, Sb and As, B is one or more elements of Group IIa of the periodic Table, e.g., the alkaline earth metals including beryllium and magnesium, and x=0.3 to 1; y=2.0 to 4.0, preferably 2.5 to 3.5; z=1.0 to 4.0, preferably 1.5 to 3.5; and w=4.0 to 10.0, preferably 6.0 to 8.0. Examples of the general formula are BiSrCaCu$_2$O$_x$ and Bi$_4$Sr$_3$Ca$_3$Cu$_4$O$_x$. Tc onset and Too samples confirmed consistent with the formula Bi$_4$Sr$_y$Ca$_3$Cu$_4$O$_x$(y is around 1.5) were measured to be 40 to 60K, which is not so high. Relatively high critical temperatures were obtained with samples conforming to the stoichiometric formulae Bi$_4$Sr$_4$Ca$_2$Cu$_4$O$_x$ and Bi$_2$Sr$_3$Ca$_2$Cu$_2$O$_x$. The number designating the oxygen proportion is 6 to 10, e.g. around 8.1. around 8.1.

What is claimed is:

1. A sputtering device for manufacturing a thin film of a superconducting oxide material on a substrate comprising:

a pair of spaced apart targets each having a substantially planar sputtering surface provided within a chamber in mutual opposition to define a film-forming region therebetween;

means for supporting in said film forming region at least one substrate to be coated having a substantially planar film-forming surface portion on which said thin film of superconducting oxide material is to be formed, said at least one film forming surface portion being oriented substantially parallel to said sputtering surfaces; and means for creating a magnetic field between the two targets, said means for creating a magnetic field positioned relative to said means for supporting a substrate such that the magnetic field is induced normal to the at least one substrate surface portion to be coated where the means for creating the magnetic field includes a first magnetic pole having a first polarity and a second magnetic pole of a polarity opposite to that of said first polarity whereby the magnetic field extends from said first magnetic pole through (a) the first one of said pair of targets, (b) the at least one substrate, and (c) the second one of said pair of targets, and then to said second magnetic pole;

wherein the at least one film-forming surface portion is positioned in the magnetic field to expedite the formation of a superconducting oxide material.

2. The sputtering device for manufacturing a superconducting oxide material of claim 1, wherein a closed magnetic circuit member is provided for forming a closed magnetic circuit in a region outside of the space between the two targets, so that the plasma between the two targets is converged by the magnetic field to form a high density plasma.

3. A method for sputtering a thin film of a superconducting oxide material generally represented by the expression $(A_{1-x}B_x)_y Cu_z O_w$, where $x = 0.1$ to 1, $y = 2.0$ to 4.0, $z = 1.0$ to 4.0 and $w = 4.0$ to 10.0, A is at least one member selected from the group of Sc (Scandium), Y (yttrium), Gd (gadolinium), Yb (ytterbium), Eu (europium), Tb (terbium), Dy (dysprosium), Ho (holmium), Er (erbium), Tm (thulium), Lu (lutetium), and other lanthanoids, and B is at least one member selected from the group of Ba (barium), Sr (strontium); and Ca (calcium); or by the expression $(A_{1-x}B_x)_y Cu_z O_w$, where A is one or more elements of Group $V_b$ of the Periodic Table, B is one or more elements of Group IIa of the Periodic Table; $x = 0.3$ to 1; $y = 2.0$ to 4.0; $z = 1.0$ to 4.0; and $w = 4.0$ to 10.0 onto a substrate comprising the steps of:

providing at least one target having a sputtering surface comprising elements of said superconducting oxide material and a substrate having a film-forming surface portion on which said superconducting oxide material is to be formed;

creating a magnetic field so that the film-forming surface portion is placed in the magnetic field with the magnetic field induced normal to the substrate surface portion and the strength of the magnetic field is sufficient to align the c axis of the superconducting oxide material perpendicular to the film forming surface portion; and sputtering said superconducting oxide material onto the film-forming surface portion, so that said thin film of superconducting oxide material is formed on the film-forming surface portion of said substrate.

4. A method as in claim 3 including providing a pair of said targets opposed to each other where the substrate is disposed between the targets.

5. A method as in claim 4 where said magnetic field is created by providing a first magnetic pole having a first polarity and a second magnetic pole having a polarity opposite to that of said first polarity whereby the magnetic field extends from said first magnetic pole through (a) the first one of said pair of targets, (b) the substrate, and (c) the second one of said pair of targets, and then to said second magnetic pole.

6. A method as in claim 5 where the strength of the magnetic field is at least 0.1 Tesla.

7. A method as in claim 3, wherein said superconducting oxide material is Bi Sr Ca Cu$_2$ Ox, Bi$_4$ Sr$_3$ Ca$_3$ Cu$_4$ Ox, Bi$_4$ Sr$_4$ Ca$_2$ Cu$_4$ Ox, or Bi$_2$ Sr$_3$ Ca$_2$ Cu$_2$ Ox, where $x = 6$ to 10.

* * * * *

UNITED STATES PATENT AND TRADEMARK OFFICE
CERTIFICATE OF CORRECTION

PATENT NO. : 4,963,524

DATED : October 16, 1990

INVENTOR(S) : Shunpei YAMAZAKI

It is certified that error appears in the above-identified patent and that said Letters Patent is hereby corrected as shown below:

On the title page, after [21] Appl. No.: 246,611 the following should be inserted Item (22) should read --Filed: Sep. 20, 1988--.

Signed and Sealed this

Ninth Day of August, 1994

*Attest:*

BRUCE LEHMAN

*Attesting Officer*   *Commissioner of Patents and Trademarks*